United States Patent [19]

Yoshida et al.

[11] 4,149,889
[45] Apr. 17, 1979

[54] DIRECT OFFSET PRINTING PLATE

[75] Inventors: Akio Yoshida; Yasuo Tsubai, both of Nagaokakyo, Japan

[73] Assignee: Mitsubishi Paper Mills, Ltd., Tokyo, Japan

[21] Appl. No.: 775,943

[22] Filed: Mar. 9, 1977

[30] Foreign Application Priority Data

Mar. 15, 1976 [JP] Japan .................................. 51-27095

[51] Int. Cl.² .......................... G03C 1/48; G03C 5/54; G03C 1/36; G03C 1/02
[52] U.S. Cl. .................................. 96/76 R; 96/29 L; 96/94 R; 96/101
[58] Field of Search ................... 96/76 R, 29 L, 94 R, 96/101

[56] References Cited

U.S. PATENT DOCUMENTS

| 3,676,125 | 7/1972 | de Haas | 96/29 L |
| 3,721,559 | 3/1973 | de Haas | 96/29 L |
| 3,728,114 | 4/1973 | Futaki et al. | 96/29 L |
| 3,957,518 | 7/1973 | Vanassche et al. | 96/94 R |

Primary Examiner—Richard L. Schilling
Attorney, Agent, or Firm—Cushman, Darby & Cushman

[57] ABSTRACT

A direct offset printing plate which comprises a support and a photographic silver halide emulsion layer and a layer containing nuclei for physical development which are coated in this order on said support. Said emulsion layer comprises fogged direct-positive silver halide emulsion wherein silver halide grains contain at least 80 mol % of bromide and has an electron acceptor on their surface and the weight ratio of binder and silver is 1/5-2. The coating amount of silver is 0.5-2.5 g/m².

8 Claims, No Drawings

DIRECT OFFSET PRINTING PLATE

BACKGROUND OF THE INVENTION

This invention relates to a printing plate, according to which a silver image obtained by the silver complex diffusion transfer process which is one of the photographic reproduction methods can be directly used as an offset printing plate and to an improvement in direct offset printing plates for negative originals disclosed in Japanese Patent Publication No. 30562/73.

Japanese Patent Publication No. 30562/73 and Japanese Patent Laid-Open Application No. 55402/74 disclose direct offset printing plates for positive originals in detail. In order to obtain direct offset printing plates for negative originals it can be considered to use a direct-positive silver halide emulsion. The emulsion layer influences printabilities such as ink receptivity, water retention, plate strength, etc. and the conditions for obtaining direct offset printing plate for negative originals which satisfy said printabilities have never been clarified.

SUMMARY OF THE INVENTION

The inventors have now discovered that a high speed direct offset printing plate for negative originals which has good printabilities can be obtained by using, as a silver halide emulsion layer, a layer of fogged direct positive silver halide emulsion which comprises silver chlorobromide grains, silver iodobromide grains, silver chloroiodobromide grains or silver bromide grains which contain at least 80 mol % of bromide and which have electron acceptor on the surface thereof and in which the weight ratio of binder and silver is 1/5 to 2 and the coating amount of silver is 0.5-2.5 g/m$^2$.

It is an object of this invention to provide a high speed direct offset printing plate for negative originals.

Another object of this invention is to provide a direct offset printing plate for negative originals having good printabilities.

Other objects and advantages of this invention will become apparent from the specification and claims which follow.

The term "direct-positive silver halide emulsion" referred to herein means a silver halide emulsion prepared so that a direct positive image can be formed through the normal exposure to light and subsequent development. Direct-positive silver halide emulsions comprising fogged silver halide grains and electron accepting compounds have been known as disclosed in, e.g., British Pat. No. 723,019.

A direct offset printing plate for negative originals can be obtained by providing a layer of a direct-positive silver halide emulsion on an appropriate support and additionally providing thereon a surface layer containing nuclei for physical development which comprise fine particles of heavy metals or sulfides thereof, at least a part of said fine particles being bared. When this direct-positive offset printing plate is subjected to imagewise exposure and development, silver halide of the unexposed part is reduced to silver, but silver halide of the exposed part which is converted to a silver salt and is dissolved diffuses to the upper layer, where it is reduced and deposited utilizing the nuclei for physical development as catalytic nuclei to form a silver image. The portions where the surface of the silver image is not bared are composed of protective colloids such as gelatin, polyvinyl alcohol, etc. and are hydrophilic while the portions where the silver image is bared are oleophilic due to the deposited silver and thus have an affinity to ink.

The nuclei for physical development applied on the hydrophilic support having a subbing layer thereon according to this invention should be applied in such a manner that fine particles of heavy metals or sulfides thereof having a diameter of about 50 Å are uniformly and planely distributed at intervals of 100-300 Å. and that the particles are dispersed in such state that at least a part of the surfaces of the fine particles are not completely and thickly wrapped with high molecular compound contained in the surface layer. The layer in which the metal fine particles are dispersed in such distribution can be obtained by vacuum evaporation method, cathode spattering method, coating method, etc. According to the vacuum evaporation method, for example, silver is evaporated and deposited under a reduced pressure of $10^{-3}$-$10^{-6}$ torr on Tetron polyethylene terephthalate film to which a suitable undercoat has been applied. A film of so-called island structure which is formed at an initial stage of formation of evaporation film is the positive material of this invention and can be easily obtained. Furthermore, according to the coating method, a hydrosol of, for example, silver having a size of about 50 Å. is prepared and this hydrosol is applied in single layer to a polyester film which has been subjected to a treatment for forming a subbing layer to impart hydrophilic property by a suitable method such as dip coating method to obtain the distribution of the metal particles similar to island structure of vacuum evaporation film. Thus obtained direct positive sheet can be used as an offset printing plate. When a sol of fine particles of heavy metals or sulfides thereof is prepared by a chemical reaction and this is applied to a support having a subbing layer thereon, special care should be given to the amount of high molecular compound added in view of protective action of colloid and increase of viscosity. In this invention, various hydrophilic high molecular weight compounds such as gelatin, polyethylene glycol, carboxymethyl cellulose, sodium alginate, etc. may be used. However, regarding the layer in which nuclei for physical development are dispersed, the positive sheet of this invention is extremely difficult from the usual positive sheet for silver complex diffusion transfer method. Unless the thickness of the high molecular weight compound film of nuclei for physical development is less than 20-30 Å., the transferred silver film cannot be naked on the surface and hence thus obtained positive sheet is not suitable as an offset printing plate. The commercial positive material has a film of a thickness of greater than hundreds Å. and transferred layer is a continuous film. On the other hand, in the positive sheet of this invention, the surfaces of the nuclei for physical development are coated with a high molecular weight film of 30 Å. in thickness, but transferred layer is not a continuous film and the nuclei are dispersed and distributed as individual particles.

In order to obtain the distribution as mentioned above, the content of the polymer should be up to 30% by weight of nuclei for physical development, although there is some difference depending upon the nuclei for physical development used and the high molecular materials used. This is already proposed in Japanese Patent Publication No. 30562/73.

There is a great correlation between the amount of silver deposited by developing treatment or the adhesion strength of silver image and halogen composition in the emulsion. With increase in the proportion of chloride in the silver halide emulsion, the adhesion strength of silver image increases. On the other hand, with increase in the proportion of the chloride, sensitivity of direct offset printing plate for negative originals decreases. In order to obtain a high-speed direct offset printing plate for negative originals, proportion of chloride may be reduced and that of bromide may be increased, but this results in reduction of adhesion strength of silver image. Owing to this defect, the direct offset printing plates for negative originals using silver halide emulsion mainly composed of silver bromide have been considered undesirable in their printability regardless of high adhesion strength of silver image.

However, as the result of the inventors' research, it has been found that said defect can be removed by limiting the weight ratio of binder and silver to 1/5-2 and the coating amount of silver to 0.5-2.5 g/m$^2$. A ratio of binder and silver of less than 1/5 is not preferred in preparation of emulsion and in coating of silver halide emulsion. When the ratio is more than 2, amount of silver deposited is reduced and this is not preferred in printing. When the coating amount of silver is less than 0.5 g/m$^2$ or more than 2.5 g/m$^2$, the amount of silver deposited is decreased and this is not preferred.

Preferred silver halide emulsions used in this invention are silver chlorobromide, silver iodobromide, silver chloroiodobromide or silver bromide emulsions which contain at least 80 mol % of bromide. A silver iodobromide emulsion containing at least 95 mol % of bromide is especially preferred for obtaining printing plates of higher speed.

As the silver halide emulsions used in this invention, both of monodisperse and non-monodisperse type may be used, but monodispersed emulsions provide more preferred results. Moreover, silver halide grains used in this invention include both regular and irregular grains, but the regular grains provide more preferred result. Furthermore, the silver halide crystal grains may have any crystal habit, but cubic grains provide more preferred result.

Gelatin is mainly used as the binder for silver halide emulsion used in this invention. Moreover, photographically inactive gelatin derivatives, water soluble synthetic polymers (e.g., polyvinyl acrylate, copolymer of acrylamide and acrylic acid, polyvinyl alcohol, polyvinyl pyrrolidone, polyvinyl alginate, etc.), etc. may be used alone or in combination with gelatin.

The silver halide emulsions used in this invention are fogged by light or a chemical fogging agent. Chemical fog speck may be given by various methods for chemical sensitization and especially good result can be obtained by using the method disclosed in "Science et Industrie Photographique" 28, 57–65 (1957) by Antoine Hautot and Henri Saubenier.

Furthermore, in this invention, the fog may be imparted by a reducing agent. As the reducing agent, stannous chloride, thiourea dioxide, formaline, alkali arsenite, hydrazine derivatives, amine borane, etc. may be used.

Moreover, in this invention, the silver halide emulsions may be fogged by using, in combination, the reducing agent and a compound of a metal which is electrically more positive than silver. Examples of such compounds are gold salts such as potassium chloroaurate, etc., platinum salts such as potassium chloroplatinate, etc. and iridium salts such as potassium hexachloroiridate, etc.

Furthermore, preferable fogging can be also attained by using said fogging agent in combination with a sulfur-containing sensitizer, e.g., sodium thiosulfate or a thiocyanic acid compound, e.g., potassium thiocyanate.

The electron acceptors used in this invention include the known desensitizers capable of trapping electrons as disclosed in British Pat. No. 723,019 and Japanese Patent Publication No. 3938/75. It is known that there is a strong correlation between anodic and cathodic half-wave potentials determined by polarography and electron acceptability. For example, this is described in "Photographic Science and Engineering" 17, 235–244 (1973) by R. W. Berriman and P. B. Gilman Jr. Therefore, it is preferred to use, as the electron acceptors, organic desensitizing dyes which have oxidation and reduction halfwave potentials determined by polarography which give a positive sum. Specific examples of the desensitizing dyes used in this invention are pinakryptol yellow, phenosafranine, Methylene Blue, pinakryptol green, 3-ethyl-5-m-nitrobenzylidene rhodanine, 3,3'-diethyl-6,6'-dinitrothiacarbocyanineiodide, among which pinakryptol yellow can provide especially good results.

In this invention, sensitizing dyes may be used in addition to the electron acceptor to obtain direct offset printing plates of higher sensitivity for negative originals. Such sensitizing dye is preferably the known cyanine dyes.

In this invention, various additives such as stabilizers for fog speck, whiteness increasing agents, ultraviolet absorbers, hardeners, surfactants, preservatives, plasticizers, matting agents, etc. may be contained in the direct-positive silver halide emulsions.

Examples of the support used in this invention are resin films such as polyethylene terephthalate, cellulose acetate, etc., synthetic paper, waterproof paper, etc. Furthermore, it is preferred for imparting adhesion strength enough to stand offset printing to subject the support to corona discharge treatment or under coating treatment.

Production of a printing plate of this invention is explained below. That is, the printing plate of this invention is subjected to a contact exposure of original or reduction or enlargement depending on sensitivity of silver halide emulsion and objects of use and then treated with a mono-bath diffusion transfer developer containing a solvent for silver halide, e.g., "Mitsubishi HishiRapid" developer, for 30 seconds to one minute to obtain an offset printing plate which can be directly used for offset printing. When the treatment is effected with a developer for silver complex diffusion transfer, unexposed silver halide is developed to blacked silver and the exposed silver halide is converted into soluble silver complex ion which diffuses to the surface and is selectively reduced to deposit on the surface of fine particles of the development nuclei. However, since the layer of the nuclei for physical development is not to be buried by the coating of the high molecular compound, the deposited metallic silver forms a silver image whose surface is bared and which has an affinity to ink. Two-bath treatment with a developer of silver salt emulsion and a transfer solution instead of the mono-bath treatment requires 3–5 minutes, but control of tone can easily be attained and so this is suitable when the original has many variations in its tone.

The first characteristic of this invention is that direct offset printing plate of high sensitivity for negative originals can be obtained.

The second characteristic of this invention is that printing masters of negative-positive can be produced from only one printing plate, the cost for plate-making is low and treatment is simple.

The third characteristic of this invention is that since exposure and development treatments are simple, mechanization or automatization of the plate-making can be easily made.

The fourth characteristic of this invention is that rapid plate-making can be attained.

The following examples, illustrating this invention, are given without any intension that the invention be limited thereto.

EXAMPLE 1

An emulsion was prepared in the following formulation.

| | | | |
|---|---|---|---|
| (I) | { | Gelatin | 32 g |
| | | Water | 220 g |
| | | Sodium chloride | 9.6 g |
| (II) | { | Silver nitrate | 96 g |
| | | Water | 800 ml |
| (III) | { | Potassium bromide | 68 g |
| | | Potassium iodide | 1.28 g |
| | | Rhodium chloride solution(*) | 2.4 ml |
| | | Ammonia (28%) | 80 ml |
| | | Water | 740 ml |
| (IV) | | Glacial acetic acid | |

[ (*)0.1 g of RhCl$_2$ . 4H$_2$O was dissolved in 100 ml of 25% sodium chloride solution. ]

Solution (II) was added to solution (I) at 40° C. and solution (III) was further added thereto with agitation. Then, this was digested at 40° C. for 10 minutes. Thereafter, solution (IV) was added and pH was made 4.0 and an aqueous solution of sodium sulfate was added to flocculate and this was washed with water. The resultant primitive emulsion was a silver chloroiodobromide emulsion containing at least 95 mol % of bromide. The primitive emulsion was redissolved and gelatin was added thereto so that the weight ratio of gelatin and silver was 1.6. Then, 0.2 mg/mole Ag of thiourea dioxide and 4.0 mg/mole Ag of potassium chloroaurate were added to fog the emulsion at 65° C. for 2 hours. To thus fogged emulsion were added 200 mg/mole Ag of pinakryptol yellow and then a hardener and a surfactant. This was then coated on a under-coated polyethylene terephthalate film and was dried. The coating amount of silver was 2.0 g/m$^2$.

Next, a palladium sulfide sol was prepared from the following formulation.

| | | | |
|---|---|---|---|
| (V) | { | Palladium chloride | 5 g |
| | | Hydrochloric acid | 40 ml |
| | | Water | 1 l |
| (VI) | { | Sodium sulfide | 8.6 g |
| | | Polyethylene glycol alkyl ether 10% | 30 ml |
| | | Water | 1 l |
| (VII) | { | Copolymer of methyl vinyl ether and maleic anhydride (Gantrez AN manufactured by GAF Co.) | 100 ml |

Solution (V) and solution (VI) were mixed with agitation and then solution (VII) was mixed therewith. Thus obtained palladium sulfide sol was coated on said emulsion layer at a speed of 5 m/min by the dipping method.

Thus obtained sheet was subjected to enlarging photographing by a plate-making camera and was developed with MITSUBISHI HISHIRAPID developing solution (treating solution for silver complex diffusion transfer) by a HISHIRAPID processor. The development was terminated after lapse of about 1 minute.

The following fixing solution and dampening solution which have been usually employed for offset printing were used.

| | |
|---|---|
| Fixing solution | |
| { Ammonium dihydrogenphosphate | 25 g |
| { Carboxymethyl cellulose | 2.5 g |
| { Water to make up | 1 l |
| Dampening solution | |
| { Ammonium dihydrogenphosphate | 10 g |
| { Nickel nitrate hexahydrate | 15 g |
| { Carboxymethyl cellulose | 4 g |
| { Glycerin | 100 g |
| { Water to make up 1 l | |

The above solutions were diluted to 10 times with water before use.

Said fixing solution was applied to the whole surface of said offset printing plate. This printing plate was set in an offset printing machine (for example, Type 250 manufactured by Addressograph-Multigraph Corp. in U.S.A.) and printing was carried out using said dampening solution. Usual offset ink was used as a printing ink. More than 2,000 copies were obtained by this printing.

EXAMPLE 2

200 ml of 0.01 N sodium chloride solution containing 5 g of gelatin was adjusted to have a pH of 4.0. Under vigorous agitation and a temperature of 60° C., in said solution were simultaneously mixed a 2 N solution of silver nitrate and a 2 N mixed solution of sodium chloride and sodium bromide (sodium chloride 80 mol % and sodium bromide 20 mol %) at an injection speed of 2.5 ml/min for 80 minutes to prepare a silver chlorobromide emulsion containing 80 mol % of chloride. To this emulsion was added gelatin and then was added an aqueous solution of sodium sulfate to flocculate and this was washed with water. Thus obtained primitive emulsion comprised cubic grains of monodisperse system which had a grains size of 0.35$\mu$. [Primitive emulsion (A)].

200 ml of 0.001 sodium chloride solution containing 5 g of gelatin was adjusted to have a pH of 4.0. Under vigorous agitation and a temperature of 60° C., in this solution were simultaneously mixed a 2 N aqueous solution of silver nitrate and a 2 N mixed solution of sodium chloride and sodium bromide (sodium chloride 20 mol % and sodium bromide 80 mol %) at an injection speed of 2.5 ml/min for 150 minutes to obtain a silver chlorobromide emulsion containing 80 mol % of bromide. Gelatin was added to this emulsion and then an aqueous solution of sodium sulfate to flocculate and this was washed with water. Thus obtained primitive emulsion also comprised cubic grains of monodisperse system which had a grain size of 0.33$\mu$ [Primitive emulsion (B)].

Each of these primitive emulsions (A) and (B) was redissolved and gelatin was added to each of the emulsions so that the weight ratio of gelatin and silver was 1.6 in each emulsion. Thereafter, to each of these emulsions (A) and (B) were added 0.2 mg/mol Ag of thiourea dioxide and 2.0 mg/mol Ag of chloroauric acid to fog the emulsions at 65° C. for 90 minutes. Using these emulsions (A) and (B), negative type direct offset printing plates for negative originals were produced in the same manner as in Example 1 and these were called sheet (A) and sheet (B), respectively. Each of these sheets (A) and (B) was cut to a suitable size to obtain sample (A) and sample (B). These samples were exposed through an optical wedge having a density difference of 0.15, developed with D-72 developing solution of Eastman Kodak Company at 20° C. for 2 minutes, fixed and washed with water. The sheet (B) had a sensitivity about 6 times that of the sheet (A).

As is clear from the above result, sheet (B) had the characteristic that it has a higher sensitivity in chemical development than sheet (A).

EXAMPLE 3

Sheet (A) and sheet (B) of Example 2 were cut into a suitable size to obtain sample (A) and sample (B), respectively. These were exposed through an optical wedge having a density difference of 0.15, treated with MITSUBISHI HISHIRAPID developing solution (a treating solution for silver complex diffusion transfer) at 20° C. for 1 minute, stopped and washed with water. Sensitivity at the toe of silver deposited at the portion of nuclei for physical development on the surface of sample (B) was higher by about 8 times than that of sample (A). The sensitivity at the toe means the relative reciprocal number of the exposure level where the diffusion transfer image appears.

As is clear from the above result, sheet (B) has higher sensitivity in transfer development than sheet (A). Comparing increases of sensitivity in chemical development (in Example 2) and transfer development, it is clearly recognized that the transfer development provides a greater increase than the chemical development. Such result has never been expected and this seems to be a phenomenon peculiar to diffusion transfer development of direct-positive silver halide emulsion.

EXAMPLE 4

200 ml of 0.01 N potassium bromide solution containing 5 g of gelatin was adjusted to have a pH of 4.0. Under vigorous agitation and a temperature of 60° C., in said solution were simultaneously mixed a 2 N aqueous solution of silver nitrate and a 2 N aqueous solution of potassium bromide at an injection speed of 4 ml/min for 90 minutes to obtain a silver bromide emulsion. Gelatin was added thereto and then an aqueous solution of sodium sulfate was added to flocculate and this was washed with water. Thus obtained primitive emulsion comprised cubic grains of monodisperse system having a grain size of $0.25\mu$. This primitive emulsion was redissolved and gelatin was added thereto so that the weight ratio of gelatin and silver was 1.0. Then, 0.2 mg/mol Ag of thiourea dioxide and 4.0 mg/mol Ag of chloroauric acid were added to said emulsion to fog it at 65° C. for 90 minutes. Using this emulsion, a sheet of direct offset printing plate for negative originals was produced in the same manner as in Example 1 and this sheet was subjected to sensitometry in the same manner as in Example 3. This sheet had a sensitivity about 10 times that of sheet (A) in Example 2.

An offset printing plate was produced from said sheet in the same manner as in Example 1 and printing was carried out to obtain more than 2,000 copies of good quality.

EXAMPLE 5

200 ml of 0.01 N potassium bromide solution containing 5 g of gelatin was adjusted to have a pH of 4.0. Then, in said solution which was kept at 60° C. and under vigorous agitation were simultaneously mixed a 2 N solution of silver nitrate and a 2 N mixed solution of potassium bromide and potassium iodide (potassium bromide 98 mol % and potassium iodide 2 mol %) at an injection speed of 2.5 ml/min for 160 minutes to obtain a silver iodobromide emulsion containing 98 mol % of bromide. Gelatin was added thereto and then an aqueous solution of sodium sulfate was added to flocculate and this was washed with water. Thus obtained primitive emulsion comprised cubic grains of monodisperse system having a grain size of $0.25\mu$. This primitive emulsion was redissolved and gelatin was added thereto so that the weight ratio of gelatin and silver was 1.0. Then, 0.2 mg/mol Ag of thiourea dioxide was added to fog the emulsion at 65° C. for 45 minutes and thereafter 4.0 mg/mol Ag of chloroauric acid was added to fog the emulsion at 65° C. for 45 minutes. This emulsion was divided into four parts. One part thereof was used as a blank and to other three parts was added 300 mg/mol Ag of each of the following dye compounds (I), (II) and (III), respectively. Thereafter, 200 mg/mol Ag of pinakryptol yellow, a hardener and a surfactant were added to each of these four emulsions and each of these emulsions was coated on an under-coated waterproof paper in an amount of 1.5 g/m² in terms of silver and was dried. Thus obtained sheets of direct offset printing plate were called sheet (C), sheet (D), sheet (E) and sheet (F). [Sheet (C) was blank, sheet (D) contained dye (I), sheet (E) contained dye (II) and sheet (F) contained dye (III).]

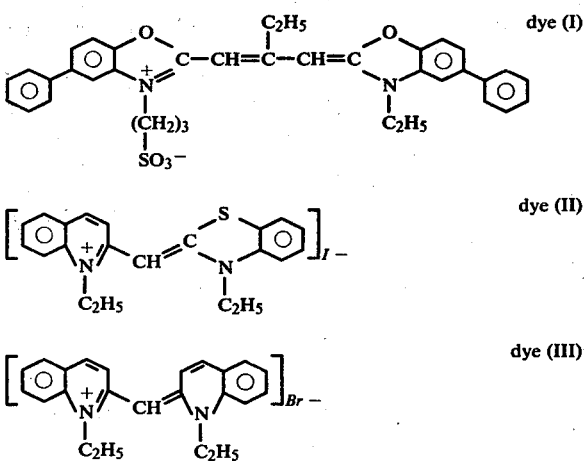

These sheets were subjected to sensitometry in the same manner as in Example 3 to compare sensitivity thereof. The results are shown in Table 1. The sensitivity was an approximate value evaluated on toe portion of the deposited silver as in Example 3.

Table

| No. | Sheet No. | Dye | Amount of addition | Relative sensitivity |
|---|---|---|---|---|
| 1 | (C) | Blank | 0 mg/mole Ag | 10 |

Table-continued

| No. | Sheet No. | Dye | Amount of addition | Relative sensitivity |
|---|---|---|---|---|
| 2 | (D) | (I) | 300 | 20 |
| 3 | (E) | (II) | 300 | 50 |
| 4 | (F) | (III) | 300 | 50 |

As is clear from the above results, direct offset printing plates of high sensitivity for negative originals, can be obtained by using the known cyanine dyes in addition to the electron acceptors.

Using these sheets (C), (D), (E) and (F), offset printing plates were produced in the same manner as in Example 1 and printing was carried out using thus obtained printing plates to obtain more than 2,000 copies of good quality.

EXAMPLE 6

In the same manner as in Example 5, a silver iodobromide emulsion (iodide 2 mol %) comprised cubic grains in monodisperse system having a grain size of $0.25\mu$ was prepared. Gelatin was added to the emulsion and then an aqueous solution of sodium sulfate was added to flocculate and this was washed with water. The resultant primitive emulsion was redissolved and gelatin was added thereto so that the weight ratio of gelatin and silver was 0.7. Thereafter, 0.2 mg/mol Ag of thiourea dioxide was added to fog the emulsion at 65° C. for 50 minutes and then 4.0 mg/mol Ag of chloroauric acid to fog the emulsion at 65° C. for 45 minutes. 300 mg/mol Ag of each of dye (II) and dye (III) was added to said emulsion, then 200 mg/mol Ag of pinakryptol yellow, a hardener and a surfactant were added thereto. The resultant emulsion was coated on waterproof papers in an amount of (1) 3.0 g/m², (2) 2.0 g/m² and (3) 1.0 g/m² in terms of silver and was dried. Thus obtained sheets of direct offset printing plate were called sheet (G), sheet (H) and sheet (I). These sheets were subjected to sensitometry in the same manner as in Example 3 to compare the sensitivities thereof. The results are shown in Table 2.

Table 2

| No. | Sheet No. | Coating amount of silver | Relative sensitivity |
|---|---|---|---|
| 1 | (G) | 3.0 g/m² | 10 |
| 2 | (H) | 2.0 g/m² | 20 |
| 3 | (I) | 1.0 g/m² | 80 |

As is clear from the above results, with decrease in the coating amount of silver the sensitivity increased.

In the same manner as in Example 1, offset printing plates were produced using said sheets (G), (H) and (I) and printing was carried out using thus obtained printing plates. Only about 500 copies were obtained in the case of sheet (G) while more than 2,000 copies were obtained in the case of sheet (H) and sheet (I).

Thus, direct offset printing plates for negative originals having higher sensitivity and good printability can be obtained by decreasing the coating amount of silver.

What is claimed is:

1. An improved direct offset printing plate which comprises in order a waterproof base paper or synthetic resin film subjected to hydrophilic treatment as a support, a photographic emulsion layer mainly composed of silver halide emulsion on the support and on the emulsion layer a layer of hydrophilic high molecular weight compound film having a thickness of not more than 30 Å which contains nuclei particles for physical development and to which an image on said emulsion layer is to be transferred, at least a part of the nuclei particles being bared, characterized in that said emulsion layer comprises fogged direct-positive halide emulsion in which silver halide grains contain at least 80 mol % of bromide and have an electron acceptor on their surface, and the weight ratio of binder to silver is 1/5-2 and the coating amount of the silver is 0.5-2.5 g/m².

2. A direct offset printing plate according to claim 1, in which the nuclei for physical development are palladium sulfide.

3. A direct offset printing plate according to claim 1, in which the silver halide particles are silver iodobromide grains containing at least 95 mol % of bromide.

4. A direct offset printing plate according to claim 1, in which the electron acceptor is a desensitizing dye having oxidation and reduction halfwave potentials determined by polarography which give a positive sum.

5. A direct offset printing plate according to claim 1, in which the electron acceptor is pinakryptol yellow.

6. A direct offset printing plate according to claim 1, in which the silver halide grains have on their surface a sensitizing dye in addition to the electron acceptor.

7. A direct offset printing plate according to claim 1, in which the silver halide grains have on their surface a cyanine dye in addition to the electron acceptor.

8. A direct offset printing plate according to claim 1, in which the coating amount of silver is not more than 1.5 g/m².

* * * * *